(12) United States Patent
Hasegawa

(10) Patent No.: US 12,484,152 B2
(45) Date of Patent: Nov. 25, 2025

(54) ELECTRONIC MODULE AND APPARATUS

(71) Applicant: CANON KABUSHIKI KAISHA, Tokyo (JP)

(72) Inventor: Mitsutoshi Hasegawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 369 days.

(21) Appl. No.: 18/149,330

(22) Filed: Jan. 3, 2023

(65) Prior Publication Data

US 2023/0225054 A1    Jul. 13, 2023

(30) Foreign Application Priority Data

Jan. 7, 2022    (JP) .................................. 2022-001734

(51) Int. Cl.
*H05K 1/18*    (2006.01)
*H05K 3/32*    (2006.01)
(Continued)

(52) U.S. Cl.
CPC ............. *H05K 1/181* (2013.01); *H05K 3/321* (2013.01); *H10F 39/809* (2025.01); *H01L 24/13* (2013.01); *H01L 24/16* (2013.01); *H01L 24/29* (2013.01); *H01L 24/32* (2013.01); *H01L 24/33* (2013.01); *H01L 24/73* (2013.01); *H01L 2224/13147* (2013.01); *H01L 2224/16225* (2013.01); *H01L 2224/29139* (2013.01); *H01L 2224/32225* (2013.01); *H01L 2224/33181* (2013.01); *H01L 2224/73204* (2013.01); *H01L 2224/73253* (2013.01); *H05K 2201/10121* (2013.01);
(Continued)

(58) Field of Classification Search
CPC ...... H05K 1/181; H05K 3/321; H10F 39/809; H01L 24/13
See application file for complete search history.

(56) References Cited

U.S. PATENT DOCUMENTS 5,847,456 A * 12/1998 Shoji .................... H05K 3/3436
257/737
5,925,936 A * 7/1999 Yamaji .................. H01L 21/563
257/E23.125
(Continued)

FOREIGN PATENT DOCUMENTS

CN    101180727 B * 6/2010 ............. H05K 3/305
CN    110620049 A * 12/2019 ............. H01L 24/16
(Continued)

*Primary Examiner* — Laura M Menz
(74) *Attorney, Agent, or Firm* — Canon U.S.A., Inc. I.P. Division

(57) ABSTRACT

An electronic module includes at least one electronic component including a first principal surface, first and second electrodes on the first principal surface, a wiring board including a second principal surface, third and fourth electrodes on the second principal surface, and a conductive resin portion. The conductive resin portion includes at least one first conductive resin portion joining the first and third electrodes, and at least one second conductive resin portion joining the second and fourth electrodes. The electronic module further includes at least one reinforcing resin portion that is disposed between at least one first and at least one second conductive resin portions and joins the first principal surface of the electronic component with the second principal surface of the wiring board.

30 Claims, 9 Drawing Sheets

(51) Int. Cl.
  *H10F 39/00* (2025.01)
  *H01L 23/00* (2006.01)
(52) U.S. Cl.
  CPC .............. *H05K 2201/10378* (2013.01); *H05K 2201/10515* (2013.01); *H05K 2201/1053* (2013.01); *H05K 2201/10734* (2013.01); *H05K 2201/2036* (2013.01); *H10F 39/804* (2025.01)

(56) References Cited

U.S. PATENT DOCUMENTS

| | | | | |
|---|---|---|---|---|
| 6,171,887 | B1* | 1/2001 | Yamaji | H01L 24/29 257/E23.125 |
| 7,935,892 | B2* | 5/2011 | Nishikawa | H01L 24/83 257/725 |
| 10,115,691 | B2* | 10/2018 | Kataoka | H04N 25/00 |
| 10,660,227 | B2* | 5/2020 | Yamamoto | H05K 9/0022 |
| 10,861,785 | B2* | 12/2020 | Ishiguri | H01L 23/49838 |
| 11,342,259 | B2* | 5/2022 | Ishiguri | H10F 39/804 |
| 11,382,209 | B2* | 7/2022 | Hasegawa | H05K 5/006 |
| 11,632,886 | B2* | 4/2023 | Hasegawa | H05K 3/3463 361/743 |
| 11,798,855 | B2* | 10/2023 | Katase | H01L 23/055 |
| 2001/0013653 | A1* | 8/2001 | Shoji | H01L 21/4853 257/738 |
| 2003/0068847 | A1* | 4/2003 | Watanabe | H05K 3/3436 438/200 |
| 2004/0046252 | A1* | 3/2004 | Fujimori | H01L 24/16 257/734 |
| 2010/0252304 | A1* | 10/2010 | Muramatsu | H01L 23/3121 174/251 |
| 2011/0147782 | A1* | 6/2011 | Sano | H10F 39/024 438/33 |
| 2012/0188735 | A1* | 7/2012 | Hiroshima | H05K 1/18 361/767 |
| 2014/0347822 | A1* | 11/2014 | Mizushiro | H05K 3/3494 361/728 |
| 2016/0181215 | A1* | 6/2016 | Sullivan | G06F 30/394 257/737 |
| 2017/0141023 | A1* | 5/2017 | Arisaka | H01L 23/49838 |
| 2017/0330852 | A1* | 11/2017 | Kataoka | H05K 1/11 |
| 2018/0063960 | A1* | 3/2018 | Sasaki | H05K 1/181 |
| 2019/0342991 | A1* | 11/2019 | Hasegawa | H05K 1/11 |
| 2019/0385940 | A1* | 12/2019 | Ishiguri | H01L 23/49816 |
| 2020/0100408 | A1* | 3/2020 | Hasegawa | H04N 25/79 |
| 2020/0128668 | A1* | 4/2020 | Naito | H05K 3/34 |
| 2021/0074626 | A1* | 3/2021 | Ishiguri | H01L 23/49838 |
| 2021/0136967 | A1* | 5/2021 | Hasegawa | H10F 39/804 |
| 2023/0225054 | A1* | 7/2023 | Hasegawa | H05K 1/181 257/432 |
| 2024/0194579 | A1* | 6/2024 | Saito | H01L 23/49811 |
| 2024/0260167 | A1* | 8/2024 | Noguchi | H05K 3/363 |

FOREIGN PATENT DOCUMENTS

| | | | | |
|---|---|---|---|---|
| CN | 110958784 A | * | 4/2020 | .............. G03B 17/02 |
| CN | 113923865 A | * | 1/2022 | .............. H05K 1/111 |
| CN | 216958013 U | * | 7/2022 | .......... H05K 3/3485 |
| CN | 113923865 B | * | 8/2023 | .............. H05K 1/18 |
| EP | 2257143 A1 | * | 12/2010 | .............. H01L 24/73 |
| JP | H1079571 A | | 3/1998 | |
| JP | 2000012616 A | | 1/2000 | |
| JP | 2003131361 A | * | 5/2003 | |
| JP | 2004179363 A | * | 6/2004 | |
| JP | 2004363434 A | * | 12/2004 | .............. H05K 3/321 |
| JP | 2005183715 A | * | 7/2005 | |
| JP | WO2006112383 A1 | * | 12/2008 | .............. H05K 3/323 |
| JP | 2012156257 A | * | 8/2012 | .............. H05K 1/18 |
| JP | 5113114 B2 | * | 1/2013 | .......... H05K 3/3452 |
| JP | 5754464 B2 | * | 7/2015 | .......... H05K 3/3494 |
| JP | WO2014112167 A1 | * | 1/2017 | .............. H01L 21/563 |
| JP | 2018037520 A | * | 3/2018 | .............. H01L 21/563 |
| JP | 6543559 B2 | * | 7/2019 | .............. H01L 24/81 |
| JP | 2019197886 A | * | 11/2019 | |
| JP | 2019220679 A | * | 12/2019 | |
| JP | 2021077710 A | * | 5/2021 | .............. H10F 39/811 |
| JP | 2021197422 A | * | 12/2021 | |
| JP | 7062030 B2 | * | 5/2022 | |
| JP | 2023101235 A | * | 7/2023 | .......... H10F 39/809 |
| JP | 7362286 B2 | * | 10/2023 | |
| JP | 7512027 B2 | * | 7/2024 | .............. H10F 39/811 |
| WO | WO-2006112383 A1 | * | 10/2006 | .............. H01L 24/83 |
| WO | WO-2006126621 A1 | * | 11/2006 | .......... H05K 3/3452 |
| WO | WO-2009107357 A1 | * | 9/2009 | .............. H01L 24/81 |
| WO | WO-2010050185 A1 | * | 5/2010 | .............. H01L 24/16 |
| WO | WO-2016194345 A1 | * | 12/2016 | .............. H04N 23/54 |
| WO | WO-2018110383 A1 | * | 6/2018 | .............. H01L 24/17 |
| WO | WO-2022113186 A1 | * | 6/2022 | .............. H05K 1/18 |
| WO | WO-2023021888 A1 | * | 2/2023 | ........ H01L 23/3121 |

* cited by examiner

ELECTRONIC MODULE AND APPARATUS

BACKGROUND OF THE INVENTION

Field of the Invention

The present disclosure relates to an electronic module and an apparatus including the electronic module.

Description of the Related Art

An imaging apparatus, which is an example of an apparatus, includes an electronic module including an electronic component that includes a photodetector, such as an image sensor. Such an electronic component has a structure in which each land (electrode) serving as a terminal is disposed on a principal surface of the electronic component. This structure eliminates the need for providing a lead terminal and makes it possible to downsize the electronic module.

Japanese Patent Application Laid-Open No. 2005-183715 discusses a structure in which electrodes on a back surface of an electronic component and conductive pads on an electronic circuit board are joined together with solder.

Since solder is used in the structure discussed in Japanese Patent Application Laid-Open No. 2005-183715, a large impact can be transferred to the electronic component, for example, when the structure is dropped. The electronic component can be slightly deviated even if the electronic component is not removed from the solder when the electronic component is subjected to impact. This is because a creep phenomenon occurs in the solder. The creep phenomenon is a phenomenon in which distortion occurs with time due to a load on a joined portion between solder and a substrate. Thus, the structure discussed in Japanese Patent Application Laid-Open No. 2005-183715 cannot be applied to an apparatus for which high positional accuracy is demanded.

For the structure in which solder is used as discussed in Japanese Patent Application Laid-Open No. 2005-183715, a process for increasing the temperature to the melting point of solder or higher is to be adopted. However, this manufacturing method cannot be adopted if the electronic component to be mounted on the structure has a low heat resistance.

SUMMARY OF THE INVENTION

According to an aspect of the present disclosure, an electronic module includes at least one electronic component including a first principal surface, a first electrode and a second electrode on the first principal surface, a wiring board including a second principal surface, a third electrode, and a fourth electrode on the second principal surface, a conductive resin portion including at least one first conductive resin portion joining the first electrode with the third electrode, and at least one second conductive resin portion joining the second electrode with the fourth electrode, and at least one reinforcing resin portion disposed between the at least one first conductive resin portion and the at least one second conductive resin portion, the at least one reinforcing resin portion joining the first principal surface of the electronic component with the second principal surface of the wiring board.

Further features of the present disclosure will become apparent from the following description of exemplary embodiments with reference to the attached drawings.

DESCRIPTION OF THE EMBODIMENTS (Apparatus)

Figure 1:
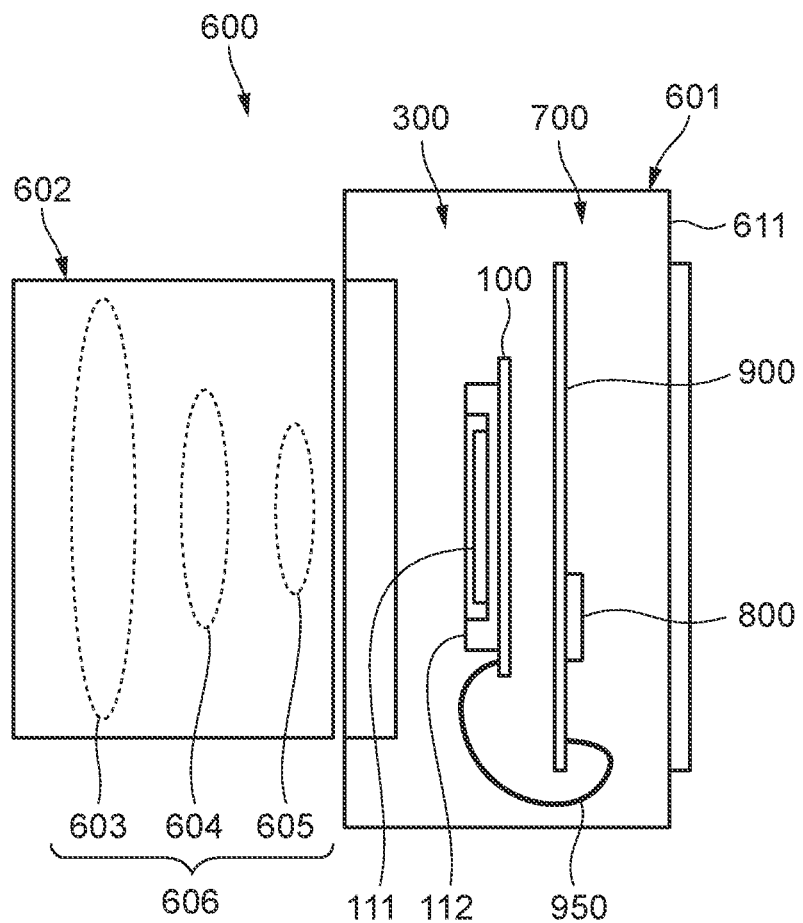
FIG. 1 is an explanatory diagram of a digital camera which is an example of an apparatus according to a first exemplary embodiment.

A first exemplary embodiment of the present disclosure will be described below. FIG. 1 is an explanatory diagram of a digital camera 600 that is an imaging apparatus serving as an example of an apparatus according to a first exemplary embodiment. The digital camera 600 is a lens-interchangeable digital camera and includes a camera body 601. A lens unit 602 including an optical system 606 including lenses 603, 604, and 605 serving as optical members is attachable to and detachable from the camera body 601. The lens unit 602 is a lens barrel. The camera body 601 includes a housing 611, an imaging module 300, and a processing module 700. The imaging module 300 and the processing module 700 are provided in the housing 611. The imaging module 300 is an example of an electronic module. The imaging module 300 and the processing module 700 are electrically connected with a cable 950.

The imaging module 300 includes an image sensor 105 and a wiring board 100. The image sensor 105 is an example of an electronic component. The image sensor 105 is mounted on the wiring board 100. The wiring board 100 is a printed wiring board including an insulating matrix. In other words, the wiring board 100 is a rigid substrate. The image sensor 105 includes a semiconductor package, which is an example of a semiconductor device. The image sensor 105 includes an imaging device 111 and an interposer 112. The imaging device 111 is an example of the semiconductor device. The interposer 112 is an example of the wiring board on which the imaging device 111 is mounted. The interposer 112 is a package substrate.

The image sensor 105 is, for example, a complementary metal oxide semiconductor (CMOS) image sensor or a charge-coupled device (CCD) image sensor. The image sensor 105 is a sensor including a photodetector (not illustrated) that includes a function of receiving incident light that has passed through the optical system 606 and converting the received light into an electric signal.

The processing module 700 includes an image processing apparatus 800 and a wiring board 900 on which the image processing apparatus 800 is mounted. The image processing apparatus 800 is an electronic component including a semiconductor package. The wiring board 900 is a printed wiring board including an insulating matrix. In other words, the wiring board 900 is a rigid substrate. The image processing apparatus 800 is, for example, a digital signal processor. The image processing apparatus 800 includes a function of acquiring the electric signal from the image sensor 105 and performing correction processing on the acquired electric signal to generate image data.

Figure 2A:
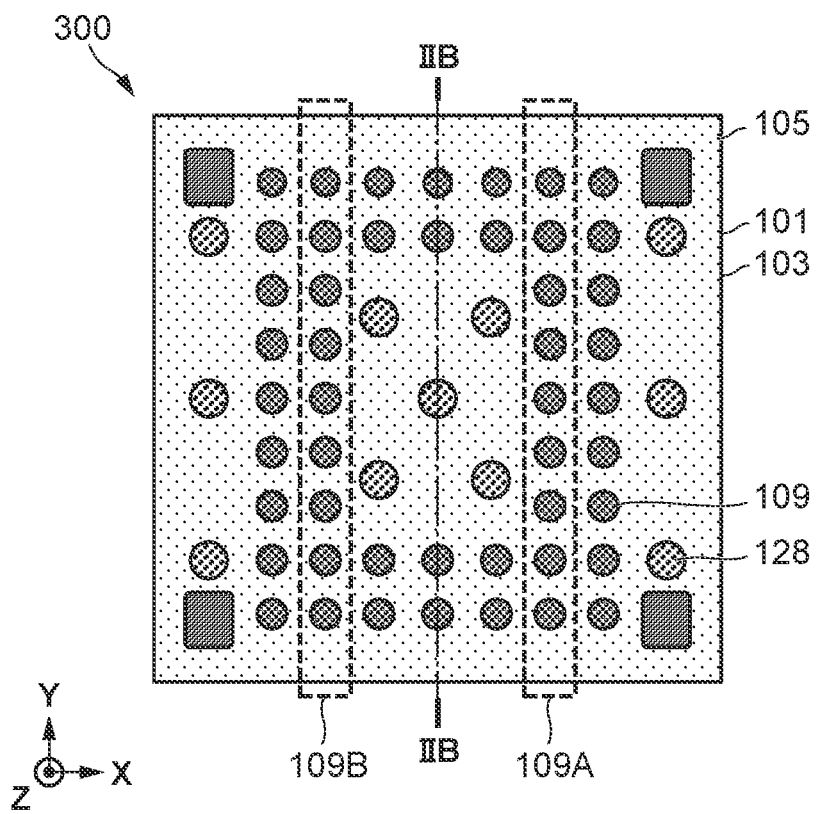
FIG. 2A is a plan view of an imaging module which is an example of an electronic module according to the first exemplary embodiment.

FIG. 2A is a plan view of the imaging module 300 according to the first exemplary embodiment. More specifically, FIG. 2A is a plan view of the imaging module 300 as viewed in a Z-direction that is perpendicular to a mounting surface of the wiring board 100 on which the image sensor 105 is mounted.

Figure 2B:
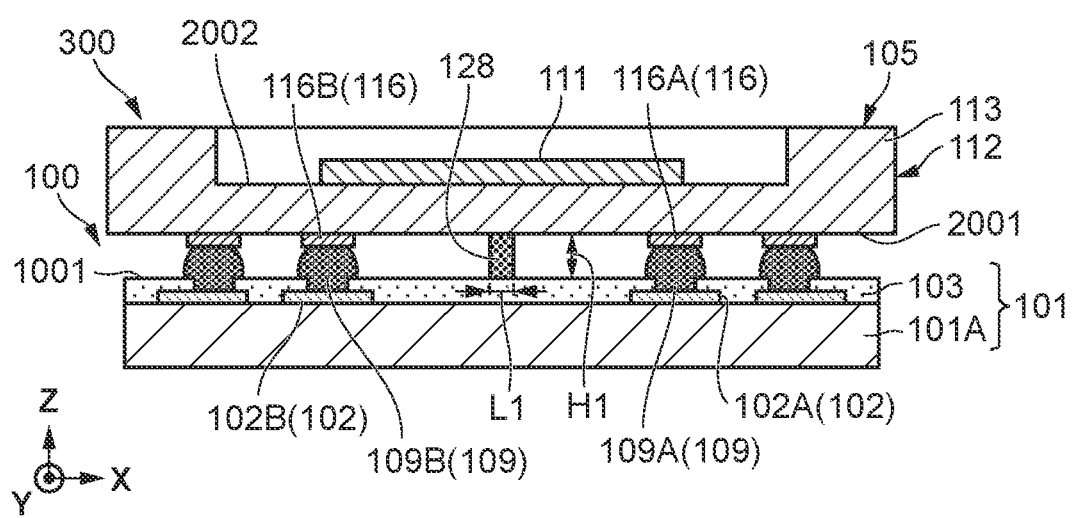
FIG. 2B is a sectional view of the imaging module according to the first exemplary embodiment.

FIG. 2A is a schematic perspective view of the image sensor 105 in the imaging module 300. FIG. 2B is a sectional view of the imaging module 300 according to the first exemplary embodiment. FIG. 2B schematically illustrates a section of the imaging module 300 taken along a line IIB-IIB in FIG. 2A.

The image sensor 105 is a land grid array (LGA) semiconductor package. Alternatively, a ball grid array (BGA) or a leadless chip carrier (LCC) semiconductor package may be used as the image sensor 105. The interposer 112, which is an example of the wiring board 100 for the image sensor 105, includes an insulating substrate 113 and a plurality of lands 116 located on a principal surface 2001 of the insulating substrate 113. The plurality of lands 116 includes a first electrode 116A and a second electrode 116B. The imaging device 111 is located on a principal surface 2002 that is opposite to the principal surface 2001 of the insulating substrate 113. The Z-direction is a direction perpendicular to the principal surface 2002. Each land 116 is a pad formed by plating the surface of a base made of conductive metal, such as copper, with nickel (Ni) and gold (Au).

Each land 116 is, for example, a signal land, a power supply land, a ground land, or a dummy land. The insulating substrate 113 is, for example, a ceramic substrate made of ceramics, such as alumina. The shape of each land 116 as viewed in the Z-direction is not particularly limited thereto. In the first exemplary embodiment, the shape of each land 116 as viewed in the Z-direction is a circular or quadrangular shape. The principal surface 2001 of the insulating substrate 113 may include a solder resist film.

The wiring board 100 includes an insulating substrate 101 and a plurality of lands 102 disposed on a principal surface 1001 of the insulating substrate 101. A solder resist film 103 is provided on the principal surface 1001. In other words, the insulating substrate 101 includes the solder resist film 103. A portion 101A of the insulating substrate 101 excluding the solder resist film 103 is formed of an insulating material, such as epoxy resin. The solder resist film 103 has openings at positions each corresponding one-to-one to the plurality of lands 102 to expose the respective lands 102 therethrough. The plurality of lands 102 includes a third electrode 102A and a fourth electrode 102B. Each land 102 is a pad formed of conductive metal, such as copper. Each land 102 is, for example, a signal land, a power supply land, a ground land, or a dummy land. The shape of each land 102 as viewed in the Z-direction, which is perpendicular to the principal surface 1001, is not particularly limited thereto. In the first exemplary embodiment, the shape of each land 102 as viewed in the Z-direction is a circular or quadrangular shape. Each land 102 and the solder resist film 103 may have a solder mask defined (SMD) or non-solder mask defined (NSMD) relationship.

The principal surface 1001 of the wiring board 100 and the principal surface 2001 of the image sensor 105 are opposed to each other in the Z-direction. The Z-direction also corresponds to the out-of-plane direction of the principal surface 2001. An X-direction and a Y-direction that are along the principal surface 2001 and are perpendicular to each other are also referred to as an XY-direction. The XY-direction corresponds to the in-plane direction of the principal surface 2001.

The imaging module 300 also includes a plurality of conductive resin portions 109 that electrically and mechanically join the image sensor 105 and the wiring board 100. The plurality of conductive resin portions 109 includes a first conductive resin portion 109A and a second conductive resin portion 109B. The conductive resin portions 109 each electrically and mechanically join the lands 116 and the lands 102 that are opposed to each other. The first conductive resin portion 109A electrically and mechanically joins the first electrode 116A and the third electrode 102A that are opposed to each other. The second conductive resin portion 109B electrically and mechanically joins the second electrode 116B and the fourth electrode 102B that are opposed to each other. Each conductive resin portion 109 is a cured product of a first resin composition and includes metallic particles and a first resin. The metallic particles are, for example, silver or copper particles. The melting point of the metallic particles is sufficiently higher than a temperature at which the first resin composition starts curing. The first resin is, for example, epoxy resin, and is a cured product of photocurable resin or thermosetting resin that cures at a temperature in a range from 25° C. to 55° C. inclusive, which falls a temperature lower than or equal to 60° C. In the imaging module 300 according to the present disclosure, the conductive resin portions 109 electrically and mechanically join the lands 116 and the lands 102. Thus, positional deviation of electronic components is less likely to occur even when the electronic components are subjected to impact, unlike in the related art in which electronic components are joined with solder.

The contour of the image sensor 105 has a quadrangular shape when the image sensor 105 is viewed in the Z-direction. The contour of the image sensor 105 as viewed in the Z-direction corresponds to the contour of the interposer 112, or the contour of the insulating substrate 113. The size of the image sensor 105 as viewed in the Z-direction is greater than the size of the wiring board 100. According to the present disclosure, even the electronic module on which the image sensor 105 that is larger than the wiring board 100 is mounted as described above has excellent resistance to impact. The conductive resin portions 109 are disposed at positions overlapping the image sensor 105 as viewed in the Z-direction, and are arranged to surround the position of the center of gravity of the area of the principal surface 2001 of the image sensor 105, in other words, the center of gravity of the interposer 112. More specifically, the conductive resin portions 109 are arranged to surround a rectangular area including the center of the interposer 112 as viewed in the Z-direction.

The imaging module 300 further includes at least one reinforcing resin portion 128 that is disposed between the interposer 112 of the image sensor 105 and the wiring board 100 and mechanically joins the interposer 112 with the wiring board 100. The reinforcing resin portion 128 includes a function of buffering the impact on the imaging module 300 when the imaging module 300 is subjected to impact, for example, when the imaging module 300 is dropped. The reinforcing resin portion 128 joins the principal surface 2001 of the image sensor 105 with the solder resist film 103 of the wiring board 100. The reinforcing resin portion 128 is disposed between the plurality of conductive resin portions 109. In an example illustrated in FIG. 2A, 11 reinforcing resin portions 128 are provided. Each reinforcing resin portion 128 is made of resin serving as an insulator having electrical insulating properties. Each reinforcing resin portion 128 includes a second resin which is the cured product of a second resin composition. The second resin is the cured product of photocurable resin or the cured product of thermosetting resin that starts curing at a temperature lower than the temperature at which the first resin composition starts curing. The second resin is, for example, epoxy resin. It is desirable that the second resin is an insulator having electrical insulating properties to prevent short-circuiting with conductive resin portions 109, but instead may contain metallic particles. In this case, it is desirable that the conductive resin portions 109 and the reinforcing resin portions 128 is arranged at intervals so as to prevent the conductive resin portions 109 and the reinforcing resin portions 128 from being short-circuited due to contact therebetween. The resistance to impact can also be enhanced by arranging the conductive resin portions 109 and the reinforcing resin portions 128 at intervals.

Assume that the length of each reinforcing resin portion 128 in a direction perpendicular to the principal surface 1001 of the wiring board 100 is represented by H1 and the length of each reinforcing resin portion 128 in a direction parallel to the principal surface 1001 of the wiring board 100 is represented by L1. In this case, it is desirable that an aspect ratio H1/L1 of each reinforcing resin portion 128 is less than or equal to 1.0. This is because when each reinforcing resin portion 128 is cured, the reinforcing resin portion 128 is compressed in the Z-direction (direction perpendicular to the principal surface 1001 of the wiring board 100) to generate a strong restraining force between the wiring board 100 and the image sensor 105, so that the joining strength of the reinforcing resin portion 128 can be enhanced. It is further desirable that the aspect ratio H1/L1 is less than or equal to 0.8. If the aspect ratio H1/L1 is extremely small, the joining strength may be decreased. Thus, the aspect ratio H1/L1 falls, further desirably, in a range from 0.4 to 0.8 inclusive.

It is desirable that the Vickers hardness of each reinforcing resin portion 128 is more than or equal to 20 Hv to maintain the interval between the image sensor 105 and the wiring board 100. It is desirable that the reinforcing resin portions 128 is harder than the plurality of conductive resin portions 109 so that the stress applied to the plurality of conductive resin portions 109 can be reduced when the imaging module 300 is subjected to a temperature shock or drop impact. If the reinforcing resin portions 128 are softer than the conductive resin portions 109, the effect of reducing the impact by the reinforcing resin portions 128 decreases and the impact on the conductive resin portions 109 increases. In other words, it is desirable that the Vickers hardness of each reinforcing resin portion 128 is higher than the Vickers hardness of each conductive resin portion 109.

Each reinforcing resin portion 128 joins the principal surface 2001 of the insulating substrate 113 of the image sensor 105 with the solder resist film 103 of the wiring board 100. However, the configuration of each reinforcing resin portion 128 is not limited to this example. Even if the wiring board 100 does not include the solder resist film 103, the principal surface 2001 may be joined with the principal surface 1001 of the insulating substrate 101.

As described above, in the imaging module 300 according to the first exemplary embodiment, the conductive resin portions 109 electrically and mechanically join the electronic components with the wiring board 100. Thus, positional deviation of the electronic components is less likely to occur even when the imaging module 300 is subjected to impact, unlike in the related art in which the electronic components are joined with solder. The reinforcing resin portions 128 including the function of buffering the impact when the imaging module 300 is subjected to impact, for example, when the imaging module 300 is dropped, are provided between the plurality of conductive resin portions 109, thus providing an electronic module having excellent resistance to impact.

(Electronic Module Manufacturing Method)

Next, a method for manufacturing the imaging module 300 will be described. FIGS. 3A, 3B, 3C, and 3D and FIGS. 4A, 4B, and 4C are explanatory diagrams each illustrating the method for manufacturing the imaging module 300 according to the first exemplary embodiment.

Figure 3A:
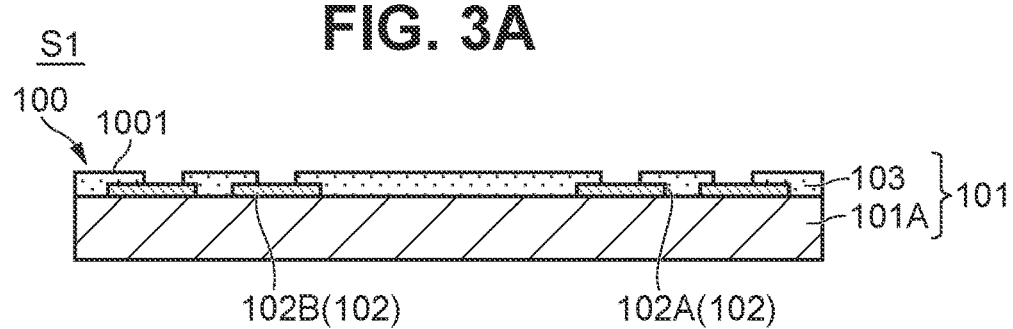
FIGS. 3A, 3B, 3C, and 3D are explanatory diagrams each illustrating a method for manufacturing the imaging module according to the first exemplary embodiment.

FIG. 3A illustrates process S1 of preparing members to be used to manufacture the imaging module 300. In process S1, as illustrated in FIG. 3A, the wiring board 100 is prepared. Although not illustrated in FIG. 3A, in process S1, the image sensor 105 is also prepared.

Figure 3B:
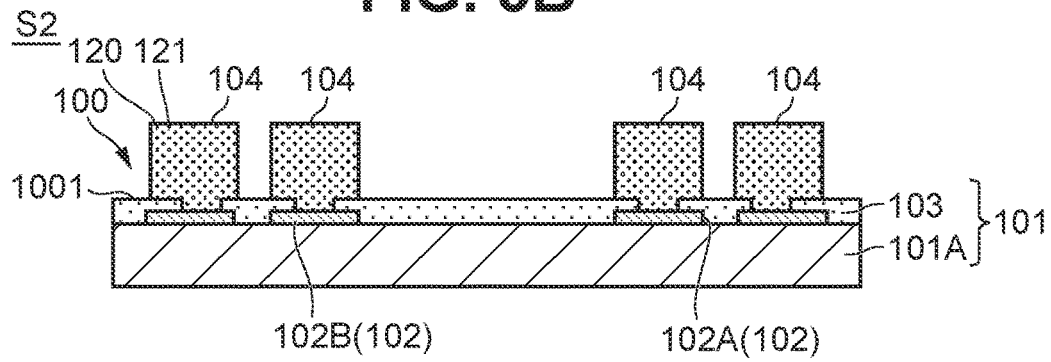

FIG. 3B illustrates process S2 of supplying a first resin composition 104 that is uncured onto each land 102. In process S2, as illustrated in FIG. 3B, the first resin composition 104 is supplied onto each land 102. The first resin composition 104 includes metallic particles 120 and a first resin 121 which is an uncured energy curable resin. The first resin composition 104 is a precursor of each conductive resin portion 109. The metallic particles 120 are, for example, silver or copper particles. The uncured first resin 121 contains a base resin and a curing agent. The melting point of the metallic particles 120 is sufficiently higher than the temperature at which the first resin 121 starts curing. The base resin is, for example, epoxy resin. The first resin composition 104 is photocurable resin or thermosetting resin that is completely cured in a range from 25° C. to 55° C. inclusive, which falls a temperature lower than or equal to 60° C. The first resin composition 104 is coated on each land 102, for example, through screen printing or by a dispenser. As illustrated in FIG. 3B, the first resin composition 104 is supplied onto each land 102 so as to cover the entire portion that is exposed from the solder resist film 103 on each land 102. If thermosetting resin is used as the uncured first resin 121, the first resin 121 may be temporarily softened by heating and then gradually cured, or may be gradually cured without being softened.

As in offset printing, the first resin composition 104 may be supplied onto each land 102 so as to cover a part of the portion exposed from the solder resist film 103 on each land 102. Instead of supplying the first resin composition 104 onto each land 102, the first resin composition 104 may be supplied onto each land 116. The first resin composition 104 may be supplied onto part or all of the plurality of lands 102 and part or all of the plurality of lands 116. In other words, the first resin composition 104 may be supplied onto the image sensor 105 and/or the wiring board 100 so that the first resin composition 104 is sandwiched between each land 102 and each land 116 in the subsequent process S4 illustrated in FIG. 3D.

Figure 3C:
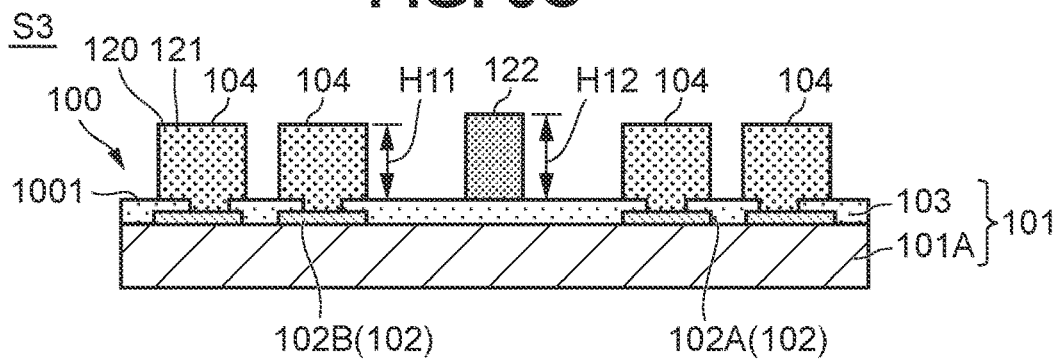

FIG. 3C illustrates process S3 of supplying a second resin composition 122 that is uncured resin. In process S3, as illustrated in FIG. 3C, the second resin composition 122 is supplied at a position at which the first resin composition 104 of the wiring board 100 is not disposed. While FIG. 3C illustrates an example where the second resin composition 122 is supplied only at one location, the second resin compositions 122 are supplied at a plurality of locations where the plurality of reinforcing resin portions 128 is to be formed as illustrated in FIG. 2A.

The second resin composition 122 is a precursor of the reinforcing resin portions 128. The second resin composition 122 contains an uncured second resin that is different from the first resin 121. The uncured second resin contains a base resin and a curing agent. The second resin composition 122 may contain a filler, such as an inorganic oxide, to adjust the strength or the like of the second resin composition 122 after curing. The second resin composition 122 is photocurable resin or thermosetting resin that is completely cured at a temperature lower than the temperature at which the first resin composition 104 is completely cured. Even at the same curing start temperature during heating under the same temperature condition, the curing rate of the second resin during heating under the same temperature condition is higher than the curing rate of the first resin 121. The curing rate may be changed by changing the content of the curing agent. The type of the base resin of the second resin may be the same as or different from the type of the base resin of the first resin 121.

The second resin composition 122 is coated on an area other than the area where the first resin composition 104 is supplied on the wiring board 100 by a dispenser so as to prevent the second resin composition 122 from contacting the first resin composition 104 on the wiring board 100. This is because mixing of the second resin composition 122 in the first resin composition 104 may inhibit the electrical conductivity of the imaging module 300. If insulating resin is used as the second resin composition 122 and the second resin composition 122 is provided on each land 102, the conductive resin portions 109 cannot be electrically connected to each land 102. The content ratio of the base resin in the second resin composition 122 is desirably larger than that in the first resin composition 104. This is because the amount of cure shrinkage of the second resin composition 122 is larger than that of the first resin composition 104, so that a force that is generated in the direction in which the interval between the wiring board 100 and the image sensor 105 is decreased can be increased and the joining strength of the reinforcing resin portion 128 can be enhanced.

In the first exemplary embodiment, the second resin composition 122 is supplied onto the solder resist film 103. In process S3, it is desirable that a height H12 in the Z-direction of the second resin composition 122 is more than or equal to a height H11 in the Z-direction of the first resin composition 104 so that the second resin composition 122 is easily contact the image sensor 105 in the process subsequent to process S3. In the first exemplary embodiment, the heights H11 and H12 are determined based on the surface of the solder resist film 103 of the wiring board 100. It is desirable that the viscosity of the second resin composition 122 is 10,000 Pa·S or more at room temperature (23° C.±2° C.). With this configuration, spreading of the second resin composition 122 on the wiring board 100 can be prevented and the height H12 is settable to a height higher than or equal to the height H11.

The second resin composition 122 may be supplied onto the principal surface 2001 of the image sensor 105. In this case, the second resin composition 122 may be supplied onto the principal surface 2001 by, for example, a dispenser or through screen printing. In other words, the second resin composition 122 may be supplied onto the image sensor 105 and/or the wiring board 100. In a case where the first resin composition 104 and the second resin composition 122 are supplied to the image sensor 105, the heights H11 and H12 are determined based on the principal surface 2001. The order of processes S2 and S3 may be reversed or may be concurrently carried out.

Figure 3D:
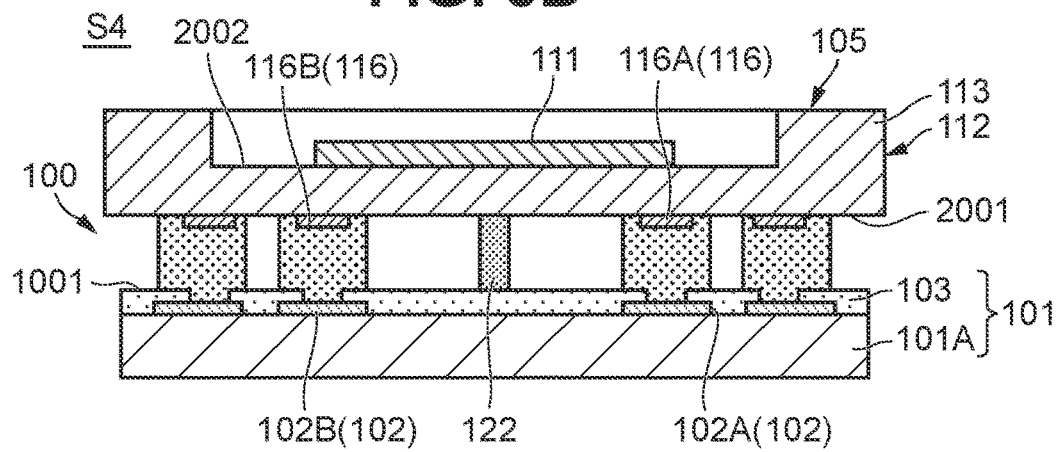

FIG. 3D illustrates process S4 of placing the image sensor 105 on the wiring board 100 to which the first resin composition 104 and the second resin composition 122 are supplied. In this process S4, the image sensor 105 is placed on the wiring board 100 using a mounter (not illustrated). In this case, the image sensor 105 is positioned such that each land 116 of the image sensor 105 contacts the first resin composition 104 on each land 102 of the wiring board 100. In this process S4, the second resin composition 122 contacts the principal surface 2001 of the insulating substrate 113 of the image sensor 105. The first resin composition 104 and the second resin composition 122 are sandwiched between the image sensor 105 and the wiring board 100. In other words, the image sensor 105 is placed on the wiring board 100 such that the first resin composition 104 and the second resin composition 122 are sandwiched between the image sensor 105 and the wiring board 100.

While the present exemplary embodiment illustrates an example where the image sensor 105 is placed on the wiring board 100 in process S4, the wiring board 100 may be placed on the image sensor 105. In other words, one of the image sensor 105 and the wiring board 100 may be placed on the other of the image sensor 105 and the wiring board 100.

After process S4, the image sensor 105 and the wiring board 100 that are disposed with the first resin composition 104 and the second resin composition 122 sandwiched therebetween are conveyed into a reflow furnace (not illustrated), which is an example of a furnace.

The first resin composition 104, the second resin composition 122, the image sensor 105, and the wiring board 100 that have been conveyed into the reflow furnace are heated under the atmosphere in the reflow furnace.

Figure 4A:
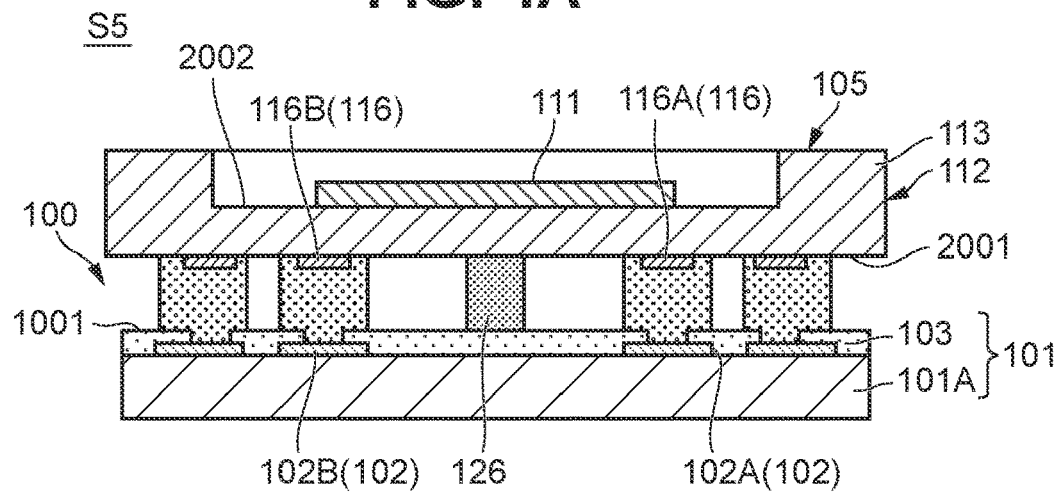
FIGS. 4A, 4B, and 4C are explanatory diagrams each illustrating a method for manufacturing the imaging module according to the first exemplary embodiment.
Figure 4B:
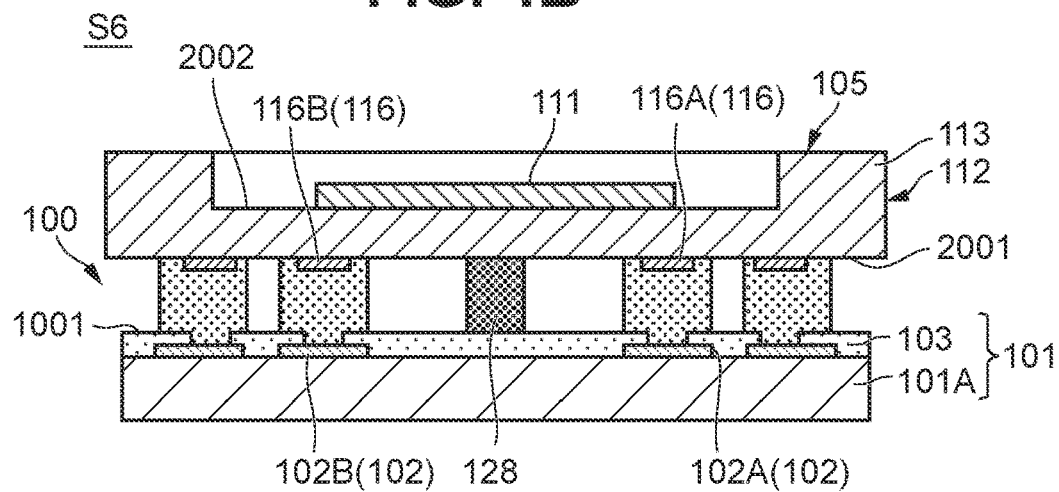
Figure 4C:
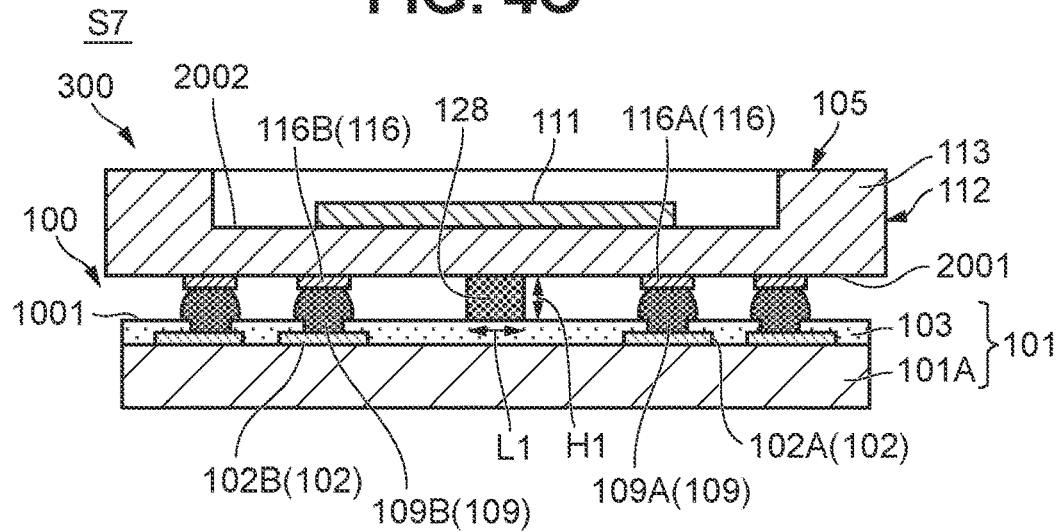

Steps S5, S6, and S7 illustrated in FIGS. 4A, 4B, and 4C, respectively, are a part of a series of heating processes illustrated in chronological order.

When heating is started, or when the process of increasing the temperature of the atmosphere in the reflow furnace is started, the second resin in the second resin composition 122 is heated under the atmosphere in the reflow furnace and an ambient temperature T in the reflow furnace is increased to a curing start temperature T2 of the second resin, so that a curing reaction starts. The ambient temperature T in the reflow furnace is further increased so that the ambient temperature T in the reflow furnace approaches a curing start temperature T1 of the first resin 121, thus promoting the curing reaction or cross-linking reaction in the second resin composition 122. FIG. 4A illustrates process S5 of increasing the ambient temperature T in the reflow furnace to the curing start temperature T1 of the first resin 121. The curing reaction of the second resin composition 122 illustrated in FIG. 3D is promoted and an intermediate 126 illustrated in FIG. 4A is obtained. The ambient temperature T in the reflow furnace is further increased so that the ambient temperature T in the reflow furnace approaches the curing start temperature T1 of the first resin 121, thus curing the intermediate 126 to obtain the reinforcing resin portion 128. Thus, in the process of increasing the temperature of the first resin composition 104 to the curing start temperature T1 of the first resin 121, the second resin in the second resin composition 122 is cured. The second resin in the second resin composition is cured by heat, thus forming the reinforcing resin portion 128.

FIG. 4B illustrates process S6 of increasing the ambient temperature T in the reflow furnace to a peak temperature TP that is higher than the curing start temperature T1 of the first resin 121. In this process S6, the first resin composition 104 is heated to the peak temperature TP that is higher than the curing start temperature T1. In this case, it is desirable that the peak temperature TP is less than or equal to 60° C. In the first exemplary embodiment, a state where curing of the first resin 121 is completed or the first resin 121 is cured to form a cured product indicates a state where the curing rate of the first resin 121 is 50% or more. Similarly, a state where curing of the second resin is completed or the second resin is cured to form a cured product indicates a state where the curing rate of the second resin composition 122 is 50% or more.

The reinforcing resin portion 128 serves as a pillar that joins the principal surface 2001 of the image sensor 105 with the solder resist film 103 of the wiring board 100, and maintains the interval between the image sensor 105 and the wiring board 100. In process S6, the reinforcing resin portion 128 maintains the interval between the image sensor 105 and the wiring board 100, thus preventing a joining failure, such as a short-circuit or open-circuit, in the conductive resin portions 109 to be formed in the subsequent process. This configuration enhances the reliability of joining in the imaging module 300 to be manufactured.

In process S6, the reinforcing resin portion 128 can maintain a substantially-constant interval between the image sensor 105 and the wiring board 100 in the XY-direction.

FIG. 4C illustrates process S7 of curing the first resin 121. After process S6, in process S7, the first resin 121 is further heated under the atmosphere at a temperature lower than the curing start temperature T1 of the first resin 121 to promote the curing reaction of the first resin 121. As a result, the conductive resin portions 109 that are formed of the cured product of the first resin composition 104 are formed.

Process S7 is feasible in the same reflow furnace as that used in processes S5 and S6. The wiring boards 100 on which the image sensor 105 is placed are sequentially conveyed into the reflow furnace.

From the viewpoint of productivity, if a sufficient time for process S7 cannot be secured in the reflow furnace, the first resin 121 may be cured by heat in another furnace, such as a batch furnace. The imaging module 300 is manufactured by the above-described manufacturing method.

The second resin composition 122 is cured by heat in the reflow furnace in process S4. However, if photocurable resin is used, a light irradiation process may be performed to start curing of the photocurable resin and then heat-curing may be started in the reflow furnace.

In the manufacturing method for the imaging module 300 according to the first exemplary embodiment described above, the conductive resin portions 109 that are obtained by curing the first resin electrically and mechanically join the electronic components and the wiring board 100. Each reinforcing resin portion 128 is formed using the second resin that is cured prior to the first resin. Thus, since the imaging module 300 can be manufactured without using solder, the imaging module 300 having higher resistance to impact can be manufactured at a lower temperature. In particular, the first resin is cured at a temperature lower than or equal to 60° C., thus reducing the adverse effect of heat on the image sensor 105 in the manufacturing process.

(Apparatus)

Figure 5:
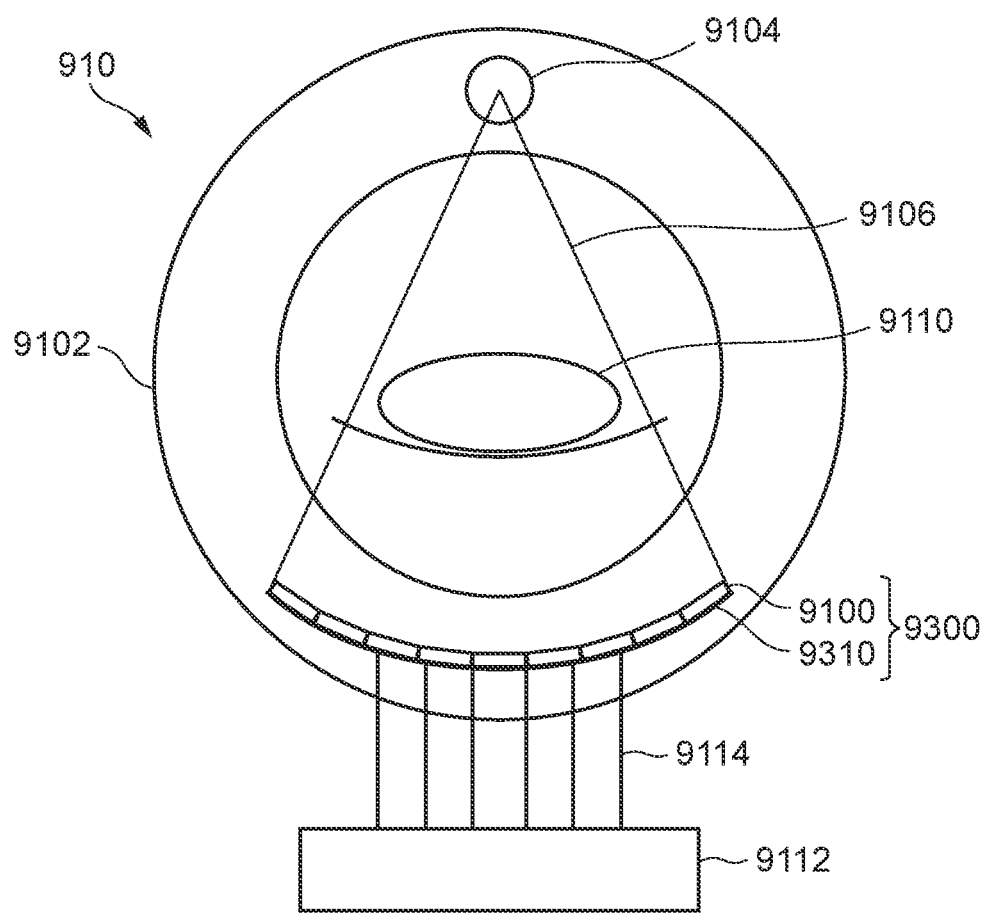
FIG. 5 is an explanatory diagram of a computed tomography (CT) imaging system which is an example of an apparatus according to a second exemplary embodiment.

A second exemplary embodiment of the present disclosure will be described below. FIG. 5 is an explanatory diagram of a computed tomography (CT) imaging system 910 serving as an imaging apparatus, which is an example of an apparatus according to the second exemplary embodiment. The CT imaging system 910 includes a drive unit 9102 as a gantry, an X-ray source 9104 as a light source, a detector array 9300, a control unit 9112, and wires 9114.

The drive unit 9102 includes a circular frame. A rotational operation of the circular frame is controllable by the control unit 9112. The X-ray source 9104 is provided on one side of the circular frame, and the detector array 9300 is provided on the other side of the circular frame. The drive unit 9102 may include a fixed portion that cannot be rotated.

The X-ray source 9104 emits X-ray light 9106. The emitted X-ray light 9106 is incident on an object 9110 that is to be measured. The object 9110 may be a living organism, such as a human, or may be a non-living material.

The detector array 9300 includes a plurality of X-ray detection modules 9100 that is an example of an electronic module, and a fixing member 9310 that fixes the plurality of X-ray detection modules 9100. The detector array 9300 is disposed in a housing (not illustrated). While FIG. 5 illustrates nine X-ray detection modules 9100, the number of the X-ray detection modules 9100 is not limited to nine. The X-ray light 9106 emitted from the X-ray source 9104 is attenuated by the object 9110 and is then received by the detector array 9300. The detector array 9300 has a curved shape, such as an arc. Thus, a 360° image of the object 9110 is capturable by the drive unit 9102 being caused to rotate once around the object 9110.

The control unit 9112 is electrically connected to the detector array 9300 via the wires 9114. Image data generated by the X-ray detection modules 9100 of the detector array 9300 is transmitted to the control unit 9112 through the wires 9114. The wires 9114 are not necessarily used. The image data generated by the detector array 9300 may be transmitted to the control unit 9112 by wireless communication. The control unit 9112 is, for example, a personal computer (PC), and includes a processor, a read-only memory (ROM), a random access memory (RAM), a hard disk drive (HDD), a recording disk drive, and an interface input/output (I/O) for communication with an external apparatus. A central processing unit (CPU) mainly controls the drive unit 9102 and the X-ray source 9104. The ROM stores basic programs for operation of the PC. The RAM is a storage device that can temporarily store various types of data, such as arithmetic processing results from the CPU. The HDD is a storage device that can store arithmetic processing results from the CPU and various data acquired from an external apparatus.

Figure 6A:
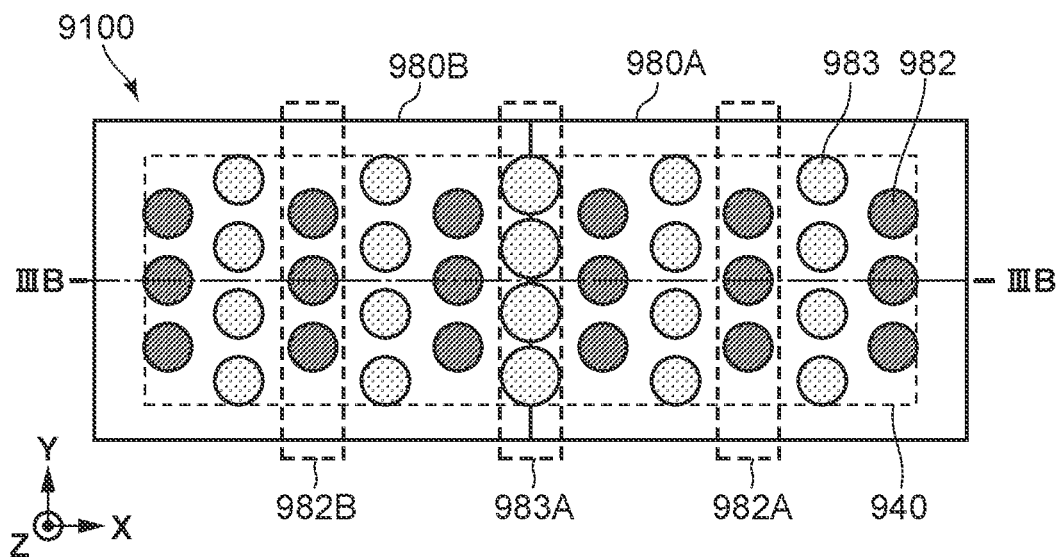
FIG. 6A is a plan view of an X-ray detection module which is an example of an electronic module according to the second exemplary embodiment.
Figure 6B:
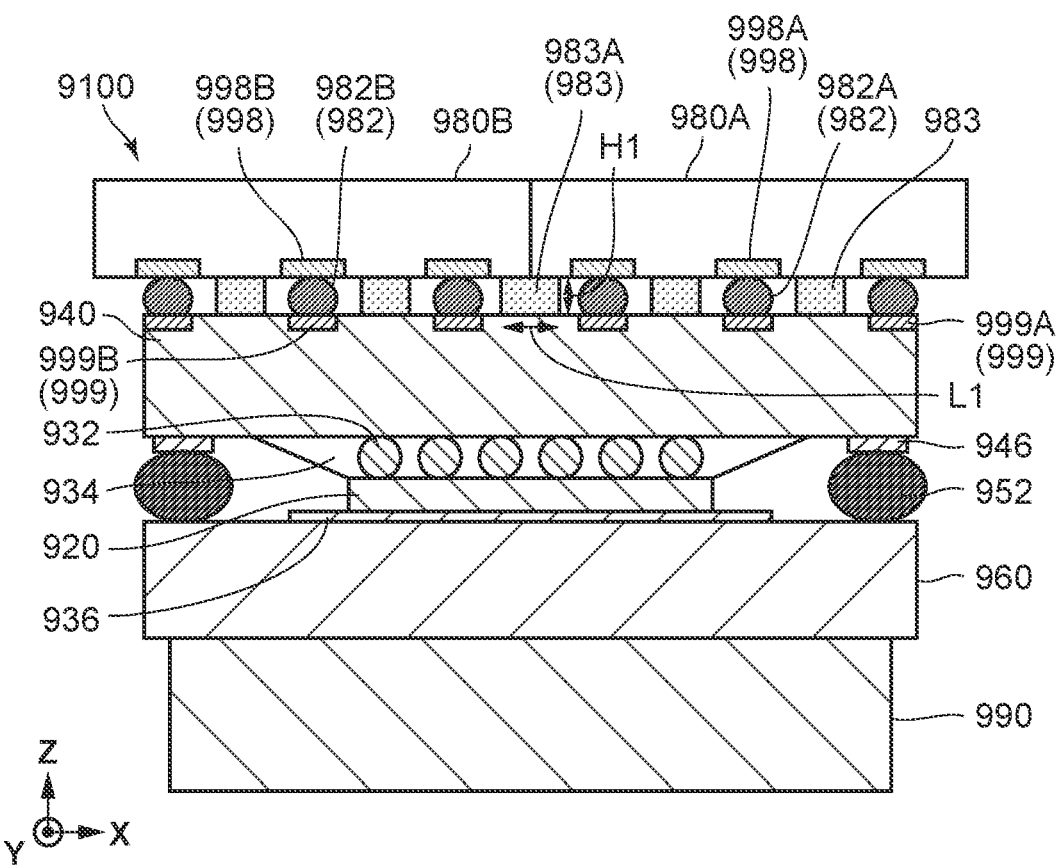
FIG. 6B is a sectional view of the X-ray detection module according to the second exemplary embodiment.

FIG. 6A is a plan view of each X-ray detection module 9100 according to the second exemplary embodiment. Specifically, FIG. 6A is a plan view of each X-ray detection module 9100 as viewed in the Z-direction that is perpendicular to a mounting surface on which X-ray detection sensors 980A and 980B are mounted in an interposer 940. FIG. 6A is a schematic perspective view of the X-ray detection sensors 980A and 980B in the X-ray detection modules 9100. FIG. 6B is a sectional view of the X-ray detection module 9100 according to the second exemplary embodiment. Specifically, FIG. 6B is a schematic sectional view of the X-ray detection module 9100 taken along a line IIIB-IIIB in FIG. 6A.

The X-ray detection module 9100 includes the X-ray detection sensors 980A and 980B, which are examples of a plurality of electronic components, and the interposer 940, which is an example of the wiring board on which the X-ray detection sensors 980A and 980B, are mounted. The X-ray detection module 9100 also includes an application specific integrated circuit (ASIC) 920, a circuit board 960, and a heat radiation portion 990.

The X-ray detection sensors 980A and 980B are a pair of sensors and have a function of converting the X-ray light 9106 received by each of the X-ray detection sensors 980A and 980B into an electric signal. The X-ray detection sensor 980A is a first sensor including a photodetector, which is an example of a first electronic component, and the X-ray detection sensor 980B is a second sensor including a photodetector, which is an example of a second electronic component. The X-ray detection sensors 980A and 980B each include an insulating substrate and a plurality of electrodes 998 disposed on a principal surface of the insulating substrate. The plurality of electrodes 998 includes a first electrode 998A and a second electrode 998B. The first electrode 998A is provided on the X-ray detection sensor 980A. The second electrode 998B is provided on the X-ray detection sensor 980B. The plurality of electrodes 998 is conductive metal. If a solder resist film is provided on the principal surface of the insulating substrate, each electrode 998 may be exposed from an opening in the solder resist film. The X-ray detection sensors 980A and 980B are disposed adjacent to each other with no gap therebetween. However, the X-ray detection sensors 980A and 980B need not necessarily be disposed adjacent to each other with no gap therebetween, but instead may be located with a gap of several millimeters therebetween. The X-ray detection sensors 980A and 980B each have a rectangular shape in planar view. The X-ray detection sensors 980A and 980B each include a pixel array, which is an example of the photodetector. This pixel array includes an X-ray-sensitive material selected from the group including cadmium zinc telluride (CZT), cadmium telluride (TeCd), gallium arsenide (GaAs), silicon (Si), and the like.

The interposer 940, which is an example of the wiring board includes an insulating substrate, a plurality of electrodes 999 disposed on a principal surface of the insulating substrate, and pads 946 that are provided on a side opposite to the side where the plurality of electrodes 999 is disposed. The insulating substrate includes an insulating matrix including a semiconductor, glass, polymer, or ceramic material, and wires (not illustrated). The wires (not illustrated) are electrically connected to the plurality of electrodes 999. The wires (not illustrated) are electrically connected to the pads 946. The pads 946 are provided on a front layer that is opposite to the plurality of electrodes 999. The plurality of electrodes 999 includes a third electrode 999A and a fourth electrode 999B. The plurality of electrodes 999 is conductive metal. If a solder resist film is provided on the principal surface of the insulating substrate, each electrode 999 may be exposed from an opening in the solder resist film.

The ASIC 920 serving as an image processing apparatus has a function of obtaining an electric signal indicating, for example, a pixel array position detected with X-ray in the X-ray detection sensors 980A and 980B, and current information, and outputting a digital signal obtained by correcting the obtained electric signal to the circuit board 960. The ASIC 920 is disposed on a side opposite to the side where the X-ray detection sensors 980A and 980B of the interposer 940 are disposed via a plurality of electrodes 932. The plurality of electrodes 932 is conductive metal, such as solder balls and copper pillars, and can be joined by, for example, a flip-chip bonding process. The plurality of electrodes 932 is reinforced by an underfill 934. The plurality of electrodes 932 is provided above the circuit board 960 through the ASIC 920 and a heat conduction layer 936. The heat conduction layer 936 has a function of transmitting heat generated from the ASIC 920 to the circuit board 960, and is formed of, for example, a silver paste layer.

The circuit board 960 has a function of outputting the digital signal obtained from the ASIC 920 to the control unit 9112 through wiring (not illustrated). The circuit board 960 is a printed wiring board including an insulating matrix. In other words, the circuit board 960 is a rigid substrate. Electrodes (not illustrated) on the circuit board 960 and the pads 946 on the interposer 940 are electrically and mechanically joined by solder balls 952. The insulating matrix of the circuit board 960 functions as a heat transmitting source for transmitting heat generated from the ASIC 920.

The heat radiation portion 990 serving as a heat sink includes a metal material having high heat conductivity, such as aluminum or copper. The heat radiation portion 990 transmits heat from the circuit board 960. The heat radiation portion 990 has a function of fixing the X-ray detection modules 9100 to the fixing member 9310.

Each X-ray detection module 9100 includes a plurality of conductive resin portions 982 that electrically and mechanically join the X-ray detection sensors 980A and 980B with the interposer 940. The plurality of conductive resin portions 982 includes first conductive resin portions 982A and second conductive resin portions 982B. The conductive resin portions 982 each electrically and mechanically join the corresponding electrode 998 and electrode 999 that are opposed to each other. The first conductive resin portion 982A electrically and mechanically joins the corresponding first electrode 998A and third electrode 999A that are opposed to each other. The second conductive resin portion 982B electrically and mechanically joins the corresponding second electrode 998B and the fourth electrode 999B that are opposed to each other. Each conductive resin portion 982 is the cured product of the first resin composition, and includes metallic particles and the first resin. The metallic particles are, for example, silver or copper particles. The melting point of the metallic particles is sufficiently higher than the temperature at which the first resin composition starts curing. The first resin is, for example, epoxy resin, and is the cured product of photocurable resin or thermosetting resin that cures in a range from 25° C. to 55° C. inclusive, which falls a temperature less than or equal to 60° C. In each X-ray detection module 9100 according to the present disclosure, the conductive resin portions 982 electrically and mechanically join the electrodes 998 with the electrodes 999. Thus, positional deviation of the electronic components is less likely to occur even when the X-ray detection modules 9100 are subjected to impact, unlike in the related art in which the electronic components are joined with solder.

The sum of the area of the X-ray detection sensor 980A and the area of the X-ray detection sensor 980B as viewed in the Z-direction is larger than the area of the interposer 940. According to the present disclosure, even the electronic module on which the X-ray detection sensors 980A and 980B that are larger than the interposer 940 are mounted has excellent resistance to impact. The plurality of conductive resin portions 982 is disposed at positions overlapping the X-ray detection sensor 980A or 980B as viewed in the Z-direction, and are arranged to surround the position of the center of gravity of the area of the principal surface of the X-ray detection sensors 980A and 980B, or the center of gravity of the interposer 940. More specifically, the plurality of conductive resin portions 982 is arranged to surround the center of the interposer 940 as viewed in the Z-direction.

Each X-ray detection module 9100 includes at least one reinforcing resin portion 983 that is disposed between the X-ray detection sensor 980 and the interposer 940 and mechanically joins the X-ray detection sensor 980 with the interposer 940. The reinforcing resin portion 983 includes a function of buffering an impact when the X-ray detection module 9100 is subjected to impact, for example, when the X-ray detection module 9100 is dropped. The reinforcing resin portion 983 joins the principal surface including the electrodes 998 of the X-ray detection sensors 980A and 980B with the principal surface including the electrodes 999 of the interposer 940. The reinforcing resin portion 983 is disposed between the plurality of conductive resin portions 982. The reinforcing resin portion 983 includes the second resin that is the cured product of the second resin composition. The second resin is the cured product of photocurable resin or the cured product of thermosetting resin that starts curing at a temperature lower than the temperature at which the first resin composition starts curing. The second resin is, for example, epoxy resin. It is desirable that the second resin is an insulator having electrical insulating properties to prevent short-circuiting with the conductive resin portions 982, but instead may contain metallic particles. In this case, it is desirable that the conductive resin portions 982 and the reinforcing resin portion 983 are disposed at intervals so as to prevent short-circuiting due to contact. The configuration in which the conductive resin portions 982 and the reinforcing resin portion 983 are disposed at intervals also makes it possible to increase the resistance to impact.

Assume that the length of the reinforcing resin portion 983 in a direction perpendicular to the principal surface of the interposer 940 is represented by H1 and the length of the reinforcing resin portion 983 in a direction parallel to the principal surface of the interposer 940 is represented by L1. In this case, it is desirable that the aspect ratio H1/L1 of the reinforcing resin portion 983 is less than or equal to 1.0. This is because when the reinforcing resin portion 983 is cured, the reinforcing resin portion 983 is compressed in the Z-direction (direction perpendicular to the principal surface of the interposer 940) to generate a strong restraining force between the interposer 940 and the X-ray detection sensors 980A and 980B, so that the joining strength of the reinforcing resin portion 983 can be enhanced. It is further desirable that the aspect ratio H1/L1 is less than or equal to 0.8. If the aspect ratio H1/L1 becomes too small, the joining strength may drop. Thus, the more desirable range of H1/L1 falls in a range from 0.4 to 0.8 inclusive.

It is desirable that the total volume of the reinforcing resin portions 983 is larger than the total volume of the conductive resin portions 982. This is because the joining strength of the reinforcing resin portion 983 can be enhanced. The total volume of the reinforcing resin portions 983 indicates the total sum of the volumes of the reinforcing resin portions 983. The total volume of the conductive resin portions 982 indicates the total sum of the volumes of the conductive resin portions 982.

It is desirable that the reinforcing resin portions 983 and the conductive resin portions 982 are disposed in a staggered manner as viewed in the direction (Z-direction) perpendicular to the X-ray detection sensor 980A. The arrangement in a staggered manner means the arrangement in which a group of reinforcing resin portions 983 and a group of conductive resin portions 982 that are aligned such that the centers of the resin portions in each group match in a predetermined direction (Y-direction) are disposed such that one of the groups does not pass through the center of the other of the groups in the direction (X-direction) intersecting with the predetermined direction. In other words, a straight line along the X-direction passing through the center of each of the reinforcing resin portions 983 does not overlap a straight line along the X-direction passing through the center of each of the conductive rein portions 982 in a planar view. A straight line along the Y-direction passing through the center of each of the reinforcing resin portions 983 does not overlap a straight line along the Y-direction passing through the center of each of the conductive rein portions 982 in a planar view.

The reinforcing resin portions 983 include a first reinforcing resin portion 983A that joins two X-ray detection sensors that are disposed to straddle the principal surface of the X-ray detection sensor 980A and the principal surface of the X-ray detection sensor 980B with the principal surface of the interposer 940. The first reinforcing resin portion 983A is disposed to straddle the adjacent X-ray detection sensors 980A and 980B, thus accurately aligning the positions (heights) of the adjacent X-ray detection sensors 980A and 980B in the Z-direction. Aligning the heights of the X-ray detection sensors 980A and 980B enhances the detection accuracy of image data to be obtained. It is also desirable that the reinforcing resin portions 983 is disposed between the X-ray detection sensors 980A and 980B. The reinforcing resin portion 983 permeates due to capillary action and is present in at least a part of end faces where the X-ray detection sensors 980A and 980B are opposed to each other. This enables protection of the end faces of the X-ray detection sensors 980A and 980B and prevention of abrasion of the end faces. It is desirable that the volume of each first reinforcing resin portion 983A is larger than the volume of each of the other reinforcing resin portions to facilitate alignment of the heights of the X-ray detection sensors 980A and 980B.

It is desirable that the Vickers hardness of the reinforcing resin portion 983 is more than or equal to 20 Hv so as to maintain the interval between the X-ray detection sensors 980A and 980B. To reduce stress that acts on the conductive resin portions 982 when the X-ray detection modules 9100 are subjected to a temperature shock or drop impact, it is desirable that the Vickers hardness of the reinforcing resin portion 983 is higher than the Vickers hardness of the conductive resin portion 982.

The reinforcing resin portion 983 joins the principal surface of the insulating substrate of the X-ray detection sensor 980 with the principal surface of the interposer 940. However, the configuration of the reinforcing resin portion 983 is not limited to this example. If the X-ray detection sensor 980 and/or the interposer 940 includes a solder resist film, the reinforcing resin portion 983 may be provided in contact with the solder resist.

As described above, in each X-ray detection module 9100 according to the second exemplary embodiment, the conductive resin portions 982 electrically and mechanically join the electronic components with the interposer 940. Thus, positional deviation of the electronic components is less likely to occur even when the X-ray detection module 9100 is subjected to impact, unlike in the related art in which the electronic components are joined with solder. The reinforcing resin portion 983 has the function of buffering an impact on the X-ray detection module 9100 when the X-ray detection module 9100 is subjected to impact, for example, when the X-ray detection module 9100 is dropped, is provided between the plurality of conductive resin portions 982. This configuration makes it possible to provide the electronic module having excellent resistance to impact. The first reinforcing resin portion 983A is provided at a position straddling the plurality of electronic components, thus accurately aligning the positions of the plurality of electronic components in the Z-direction.

Modified Examples

Figure 7:
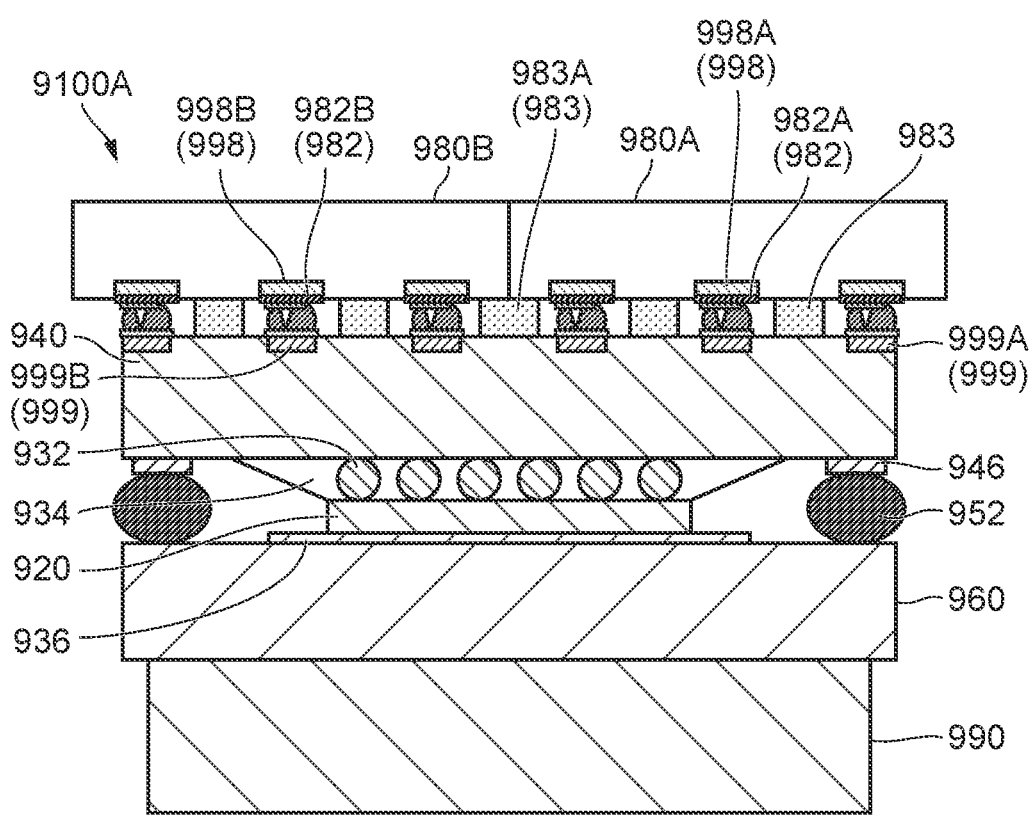
FIG. 7 is a sectional view of an X-ray detection module according to a modified example.

FIG. 7 is a sectional view of an X-ray detection module 9100A according to a modified example. The shape of each of a first electrode 998A and a second electrode 998B in the X-ray detection module 9100A according to the modified example illustrated in FIG. 7 is different from that in the second exemplary embodiment illustrated in FIG. 6B.

In the X-ray detection module 9100A illustrated in FIG. 7, the first electrode 998C and the second electrode 998D are each formed in the shape of a metal bump (convex portion). The conductive resin portions 982 are formed to cover the corresponding one of the bumps, and electrically and mechanically join the first electrode 998C with a corresponding third electrode 999A. The conductive resin portions 982 electrically and mechanically each join the second electrode 998B with a corresponding fourth electrode 999D. In the X-ray detection module 9100A according to the modified example illustrated in FIG. 7, the bumps are formed on the first electrode 998C and the second electrode 998D, respectively, but instead the third electrode 999C and the fourth electrode 999D may be formed of bumps. In other words, any one of the first electrode 998C, the second electrode 998D, the third electrode 999C, and the fourth electrode 999D may include a bump (convex portion).

(Electronic Module Manufacturing Method)

Next, a method for manufacturing each X-ray detection module 9100 will be described. FIGS. 8A, 8B, and 8C and FIGS. 9A, 9B, and 9C are explanatory diagrams each illustrating the method for manufacturing the X-ray detection modules 9100 according to the second exemplary embodiment.

Figure 8A:
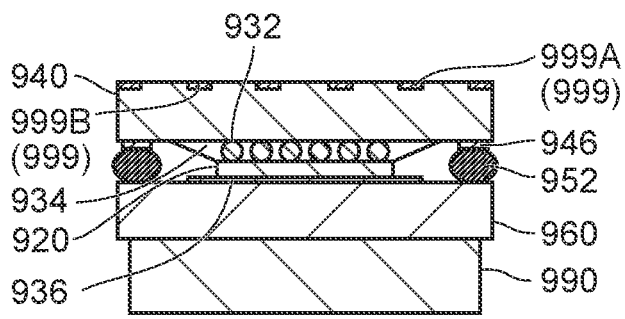
FIGS. 8A, 8B, and 8C are explanatory diagrams each illustrating a method for manufacturing the X-ray detection module according to the second exemplary embodiment.

FIG. 8A illustrates process S21 of preparing members used to manufacture the X-ray detection module 9100. In process S21, as illustrated in FIG. 8A, the intermediate in which the heat radiation portion 990, the circuit board 960, the ASIC 920, and the interposer 940 are stacked is prepared.

Although not illustrated in FIG. 8A, in this process S21, the X-ray detection sensors 980A and 980B are also prepared.

Figure 8B:
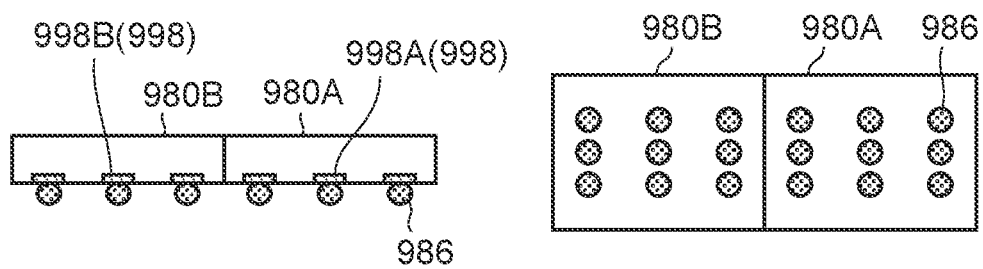
Figure 8C:
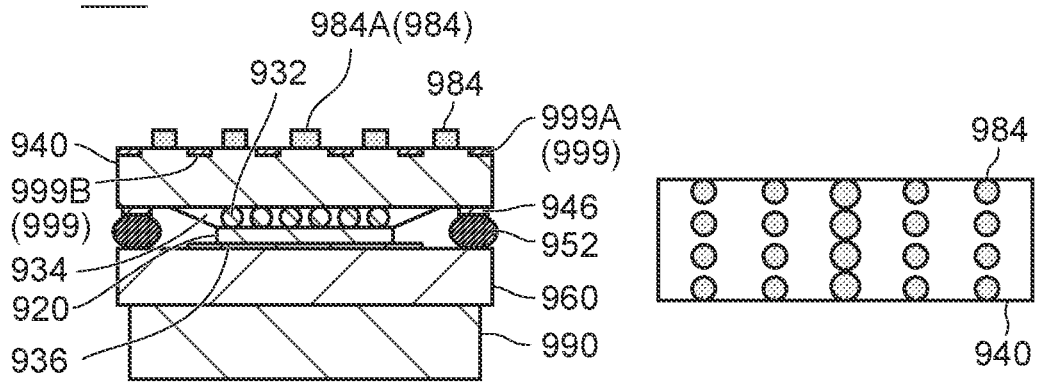

FIGS. 8B and 8C each illustrate process S22. FIG. 8B will be initially described. Process S22 illustrated in FIG. 8B indicates an example where an uncured first resin composition 986 is supplied to the plurality of electrodes 998 of the X-ray detection sensors 980A and 980B. The first resin composition 986 is coated on each of the first electrode 998A of the X-ray detection sensor 980A and the second electrode 998B of the X-ray detection sensor 980B. The first resin composition 986 includes metallic particles and the first resin which is uncured energy curable resin. The first resin composition 986 is a precursor of the conductive resin portion 982. The metallic particles are, for example, silver or copper particles. The uncured first resin contains a base resin and a curing agent. The melting point of the metallic particles is sufficiently higher than the temperature at which the first resin starts curing. The base resin is, for example, epoxy resin. The first resin composition 986 is photocurable resin or thermosetting resin that is completely cured in a range from 25° C. to 55° C. inclusive, which falls a temperature less than or equal to 60° C. The first resin composition 986 is coated on each of the electrodes 998, for example, through screen printing or by a dispenser.

FIG. 8C illustrates an example where an uncured second resin composition 984 is supplied onto the principal surface of the interposer 940 of the intermediate described above in process S22. The second resin composition 984 is coated on the principal surface of the interposer 940. The second resin composition 984 includes the uncured second resin that is different from the first resin. The uncured second resin contains a base resin and a curing agent. The second resin composition 984 is a precursor of the reinforcing resin portion 983. The second resin composition 984 may contain a filler, such as an inorganic oxide, to adjust the strength or the like of the second resin composition 984 after curing. The second resin composition 984 is photocurable resin or thermosetting resin that is completely cured at a temperature lower than the temperature at which the second resin composition is completely cured. Alternatively, at the same curing start temperature when the resin is heated under the same temperature condition, the curing rate of the second resin when the resin is heated under the same temperature condition is higher than the curing rate of the first resin. The curing rate may be changed by changing the content of the curing agent. The type of the base resin of the second resin may be the same as or different from the type of the base resin of the first resin. The second resin composition 984 is coated on each electrode 999, for example, through offset printing or by a dispenser.

The second resin composition 984 is coated at a location where the second resin composition 984 does not contact the first resin composition 986 when the above-described intermediate is joined with each X-ray detection sensor. This is because mixing of the second resin composition 984 in the first resin composition 986 inhibits the electrical conductivity of the X-ray detection module 9100. It is desirable that the content ratio of the base resin in the second resin composition 984 is larger than that in the first resin composition 986. This is because the amount of cure shrinkage of the second resin composition 984 is larger than that of the first resin composition 986, so that a force that is generated in the direction in which the interval between the X-ray detection sensors 980A and 980B and the interposer 940 is decreased is increased and the joining strength of the reinforcing resin portion 983 is enhanced.

It is also desirable that the second resin composition 984 is supplied to the position straddling the X-ray detection sensors 980A and 980B when the above-described intermediate is joined with each X-ray detection sensor. The volume of each second resin composition 984 to be supplied to the portion straddling the X-ray detection sensors 980A and 980B is desirably larger than the volume of each second resin composition 984 to be supplied to the other portions. With this configuration, the first reinforcing resin portion 983A can be formed in the subsequent process S24 of curing the second resin composition.

Figure 9A:
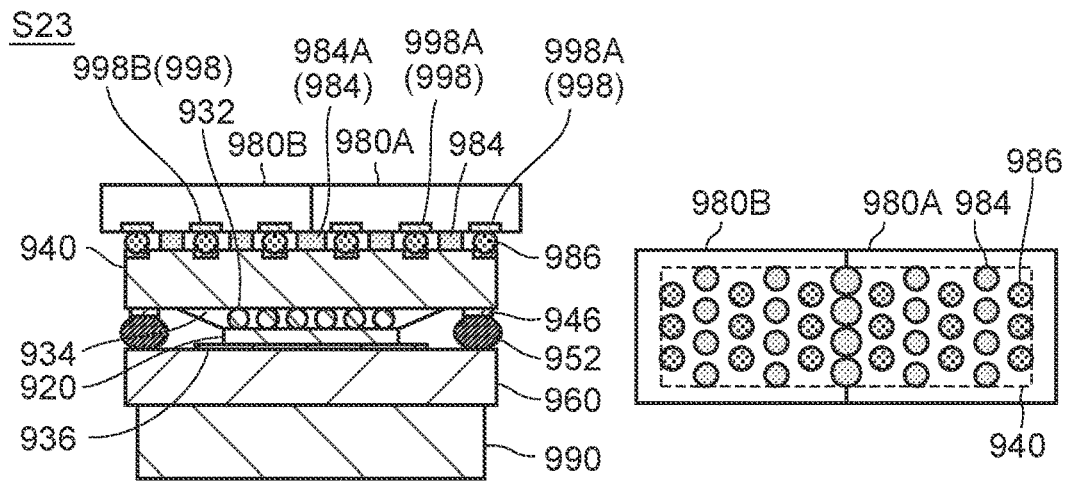
FIGS. 9A, 9B, and 9C are explanatory diagrams each illustrating a method for manufacturing the X-ray detection module according to the second exemplary embodiment.

FIG. 9A illustrates process S23 of placing the X-ray detection sensors 980A and 980B on the interposer 940. In process S23, the X-ray detection sensors 980A and 980B are placed on the interposer 940 using a mounter (not illustrated). More specifically, the X-ray detection sensors 980A and 980B are placed such that the first resin composition 986 provided on the X-ray detection sensors 980A and 980B is disposed on the plurality of electrodes 999 of the interposer 940. In this process S23, the second resin composition 984 contacts the principal surface of each of the X-ray detection sensors 980A and 980B. The first resin composition 986 and the second resin composition 984 are then interposed between the X-ray detection sensors 980A and 980B and the interposer 940. The first resin composition 986 and the second resin composition 984 are disposed at an interval.

Figure 9B:
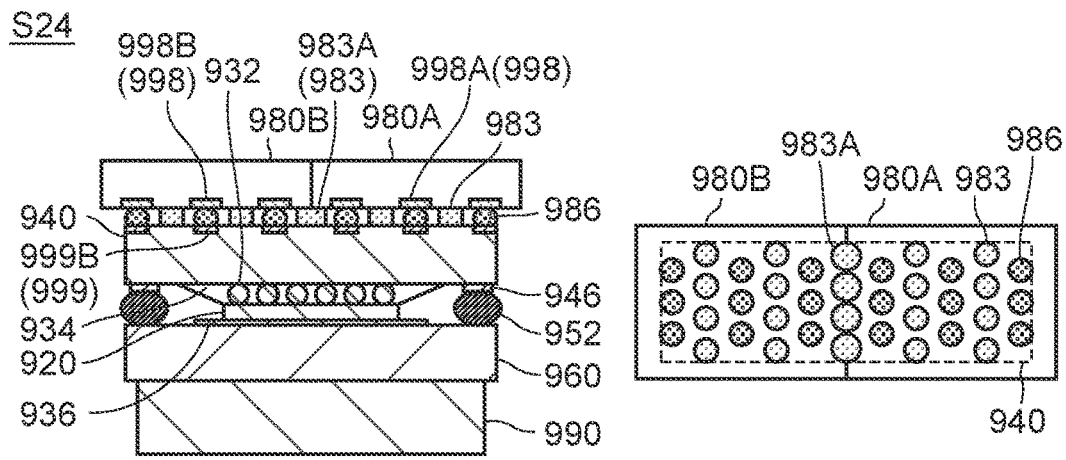

FIG. 9B illustrates process S24 of curing the second resin composition 984. After process S23, the X-ray detection sensors 980A and 980B between which the first resin composition 986 are sandwiched and the second resin composition 984 and the intermediate are conveyed into a reflow furnace (not illustrated), which is an example of a furnace. The first resin composition 986 and the second resin composition 984 having been conveyed into the reflow furnace are heated under the atmosphere in the reflow furnace. When the process of increasing the temperature of the atmosphere in the reflow furnace is started, the second resin in the second resin composition 984 is heated under the atmosphere in the reflow furnace. When the ambient temperature T in the reflow furnace is increased to the curing start temperature T2 of the second resin, a curing reaction starts. The second resin composition 984 is cured prior to the first resin composition 986, so that the reinforcing resin portion 983 is formed.

Figure 9C:
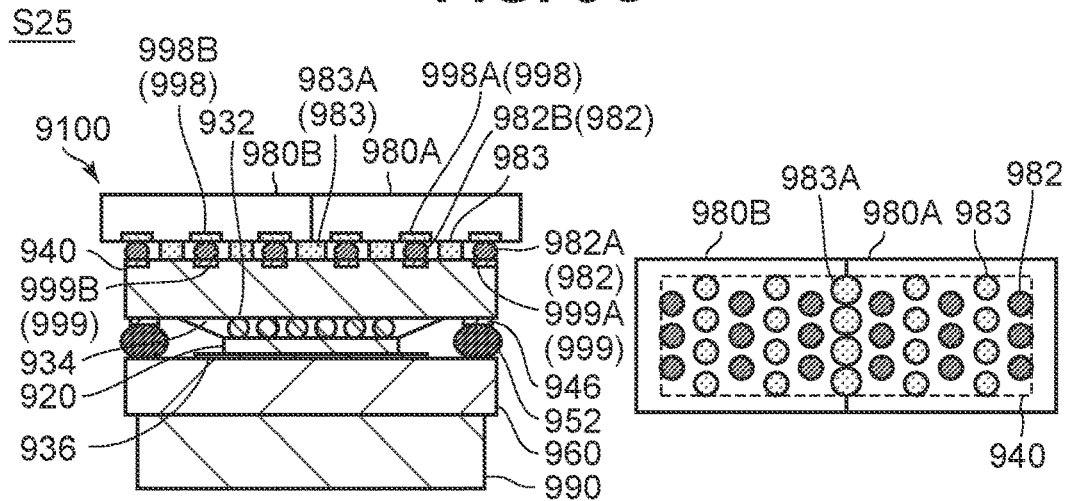

FIG. 9C illustrates process S25 of curing the first resin composition 986. After process S24, the ambient temperature T in the reflow furnace is further increased so that the ambient temperature T approaches the curing start temperature T1 (temperature higher than T2) of the first resin. Further, the ambient temperature T in the reflow furnace is increased to the peak temperature TP that is higher than the curing start temperature T1 of the first resin to complete curing of the first resin composition, thus forming the conductive resin portions 982. In this case, the peak temperature TP is desirably lower than or equal to 60° C. This is because the degradation in performance does not occur at a temperature lower than or equal to 60° C., although the X-ray-sensitive material CZT included in the X-ray detection sensors 980A and 980B has lower heat resistance. In the second exemplary embodiment, a state where curing of the first resin is completed or the first resin is cured to form a cured product indicates a state where the curing rate of the first resin is 50% or more. Similarly, a state where curing of the second resin is completed or the second resin is cured to form a cured product indicates a state where the curing rate of the second resin is 50% or more.

The reinforcing resin portion 983 serves as a pillar that joins the principal surface of each of the X-ray detection sensors 980A and 980B with the principal surface of the interposer 940, and maintains the interval between the X-ray detection sensors 980A and 980B and the interposer 940. In process S25, the reinforcing resin portion 983 maintains the interval between the X-ray detection sensors 980A and 980B and the interposer 940, thus preventing a joining failure, such as a short-circuit or open-circuit, in the conductive resin portions 982 to be formed in the subsequent process. This enhances the reliability of joining in the X-ray detection module 9100 to be manufactured. Further, the reinforcing resin portion 983 includes the first reinforcing resin portion 983A that is disposed to straddle the principal surface of the X-ray detection sensor 980A and the principal surface of the X-ray detection sensor 980B and joins the principal surfaces of the X-ray detection sensor 980A and the X-ray detection sensor 980B with the principal surface of the interposer. Since the reinforcing resin portion 983A is disposed to straddle the adjacent X-ray detection sensors 980A and 980B, the positions of the adjacent X-ray detection sensors 980A and 980B in the Z-direction can be aligned with higher accuracy. The volume of each first reinforcing resin portion 983A is larger than the volume of each of the other reinforcing resin portions, thus aligning the positions of the adjacent X-ray detection sensors 980A and 980B in the Z-direction with higher accuracy.

In the process of process S24, the second resin composition 984 permeates in the gap between the X-ray detection sensors 980A and 980B due to capillary action. This enables the reinforcing resin portion 983 to be interposed between the end faces where the X-ray detection sensors 980A and 980B are opposed to each other. The configuration in which the reinforcing resin portion 983 is present at the end faces of the X-ray detection sensors 980A and 980B makes it possible to protect the end faces of the X-ray detection sensors 980A and 980B and prevent abrasion of the end faces.

In the method for manufacturing the X-ray detection module 9100 according to the second exemplary embodiment described above, the conductive resin portions 982 that are obtained by curing the first resin electrically and mechanically join the electronic components with the wiring board. The reinforcing resin portion 983 is formed using the second resin that is cured prior to the first resin. In this manner, since the X-ray detection module 9100 can be manufactured without using solder, the imaging module 300 having higher resistance to impact can be manufactured at a lower temperature. In particular, the first resin is cured at a temperature lower than or equal to 60° C., thus reducing the adverse effect of heat on the X-ray detection sensors 980A and 980B in the manufacturing process.

The present disclosure is not limited to the above-described exemplary embodiments, and various modifications can be made within the technical idea of the present disclosure. In addition, the effects described in the exemplary embodiments are merely examples of the most suitable effects produced by the present disclosure. Thus, the effects of the present disclosure are not limited to the effects described in the exemplary embodiments.

While the above-described first exemplary embodiment illustrates a case where the electronic module is an imaging module and the electronic component is an image sensor, the present disclosure is not limited to this case. For example, the present disclosure is also applicable to the processing module 700 illustrated in FIG. 1. In such a case, the processing module 700 is the electronic module and the image processing apparatus 800 is the electronic component. The present disclosure is also applicable to, for example, a semiconductor device including a memory integrated circuit (IC) or a power supply IC as an electronic component. The present disclosure is also applicable to any electronic component in addition to the semiconductor device, as long as the electronic component includes a plurality of external terminals such as LGA, LCC, or BGA and the plurality of external terminals is arranged to surround a central portion.

While the above-described exemplary embodiments illustrate a digital camera and a CT imaging system as examples of the apparatus according to the present disclosure, the present disclosure is not limited to these examples. For example, the present disclosure can be applied to any apparatus, including a mobile communication apparatus such as a smartphone, a tablet, and a mobile PC, and an image forming apparatus.

According to the present disclosure, it is possible to provide an electronic module having excellent resistance to impact, and a method for manufacturing the electronic module having excellent resistance to impact at low temperature.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-001734, filed Jan. 7, 2022, which is hereby incorporated by reference herein in its entirety.

What is claimed is:

1. An electronic module comprising:
a plurality of electronic components including a first electronic component having a first electrode on a principal surface of the first electronic component and a second electronic component having a second electrode on a principal surface of the second component, the second electronic component being disposed adjacent to the first electronic component;
a wiring board including a third electrode and a fourth electrode on a principal surface of the wiring board;
a conductive resin portion including a first conductive resin portion joining the first electrode with the third electrode, and a second conductive resin portion joining the second electrode with the fourth electrode; and
a reinforcing resin portion disposed at least between the first conductive resin portion and the second conductive resin portion,
wherein the reinforcing resin portion is disposed to straddle the principal surface of the first electronic component and the principal surface of the second electronic component, and the reinforcing resin portion joining each of the principal surfaces of the first and second electronic components with the principal surface of the wiring board.

2. The electronic module according to claim 1, wherein the reinforcing resin portion is disposed at intervals from the first conductive resin portion and the second conductive resin portion.

3. The electronic module according to claim 1, wherein an aspect ratio H1/L1 representing a ratio of a length H1 of the reinforcing resin portion in a direction perpendicular to the principal surface of the wiring board to a length L1 of the reinforcing resin portion in a direction parallel to the principal surface of the wiring board is less than or equal to 1.0.

4. The electronic module according to claim 3, wherein the aspect ratio H1/L1 falls in a range from 0.4 to 0.8 inclusive.

5. The electronic module according to claim 1, wherein a total volume of the reinforcing resin portion is larger than a total volume of the conductive resin portion.

6. The electronic module according to claim 1,
wherein the first conductive resin portion includes a plurality of first conductive resin portions, the second conductive resin portion includes a plurality of second conductive resin portions, and the reinforcing resin portion includes a plurality of reinforcing resin portions, and
wherein the plurality of reinforcing resin portions and the plurality of conductive resin portions are disposed in a staggered manner as viewed in a direction perpendicular to the principal surface of the wiring board.

7. The electronic module according to claim 1, wherein the reinforcing resin portion is a cured product of photocurable resin or a cured product of thermosetting resin that starts curing at a temperature lower than a temperature at which the conductive resin portion starts curing.

8. The electronic module according to claim 1, wherein the conductive resin portion includes a cured product of epoxy resin.

9. The electronic module according to claim 1, wherein the conductive resin portion comprises silver or copper.

10. The electronic module according to claim 1, wherein either one of the first electrode and the third electrode includes a bump.

11. The electronic module according to claim 1,
wherein the principal surface of the wiring board includes solder resist, and
wherein the reinforcing resin portion joins the principal surfaces of the first and second electronic components with the solder resist.

12. The electronic module according to claim 1, wherein the second electronic component is disposed adjacent to the first electronic component in a first direction, the first and second electronic components are larger than the wiring board in a second direction as viewed in a third direction perpendicular to the principal surface of the wiring board, and
wherein the first, second and third directions being perpendicular to each other.

13. The electronic module according to claim 1, wherein each of the first and second electronic components includes a material composed of cadmium, zinc, telluride, gallium and/or arsenide.

14. The electronic module according to claim 1, further comprising an integrated circuit electrically connected to the first and second electronic component via the wring board,
wherein the integrated circuit is disposed on a side opposite a side where the first and second electronic component are disposed, and the integrated circuit is joined to the wiring board by solder.

15. The electronic module according to claim 1, wherein the reinforcing resin portion is disposed between the first electronic component and the second electronic component.

16. The electronic module according to claim 1, wherein a Vickers hardness of the reinforcing resin portion is higher than a Vickers hardness of the conductive resin portion.

17. The electronic module according to claim 1, wherein a total sum of an area of the first electronic component and an area of the second electronic component is larger than an area of the wiring board as viewed in a direction perpendicular to the principal surface of the wiring board.

18. The electronic module according to claim 1, wherein the first electronic component includes a first photodetector, and the second electronic component includes a second photodetector.

19. An apparatus comprising:
a housing; and
the electronic module according to claim 1, the electronic module being disposed in the housing.

20. An apparatus comprising:
a light source; and
the electronic module according to claim 13, the electronic module being disposed at a position at which a light from the light source is receivable by the conductive resin portion.

21. The apparatus according to claim 20, wherein the light source is an X-ray source.

22. The apparatus according to claim 19, further comprising a drive unit to cause the electronic module to rotate in the housing.

23. An apparatus comprising:
a plurality of electronic modules each of which is the electronic module according to claim 1; and
a member which fixes the plurality of the electronic modules.

24. An apparatus comprising:
an X-ray source; and
a detector array to detect an X-ray,
wherein the detector array comprises a plurality of electronic modules each of which is the electronic module according to claim 1.

25. The apparatus according to claim 24, wherein the apparatus is configured as a computed tomography (CT) imaging system.

26. The electronic module according to claim 14, further comprising a circuit board electrically connected to the wiring board, wherein the integrated circuit is disposed between the wiring board and the circuit board.

27. The electronic module according to claim 12, wherein a total sum of a size of the first electronic component in the first direction and a size of the second electronic component in the first direction is larger than a size of the wiring board in the first direction.

28. The electronic module according to claim 1, wherein the conductive resin portion is a cured product of curable resin that starts curing at a temperature lower than or equal to 60° C.

29. The electronic module according to claim 1, wherein the first electronic component includes an X-ray-sensitive material electrically connected to the third electrode, and the second electronic component includes an X-ray-sensitive material electrically connected to the fourth electrode.

30. The electronic module according to claim 1, wherein each of the first and second electronic components includes a material selected from the group including cadmium zinc telluride, cadmium telluride, and gallium arsenide.

* * * * *